United States Patent
Braswell et al.

(10) Patent No.: US 9,641,190 B1
(45) Date of Patent: May 2, 2017

(54) CONTINUOUS-TIME CASCADED SIGMA-DELTA ANALOG-TO-DIGITAL CONVERTER

(71) Applicant: FREESCALE SEMICONDUCTOR, INC., Austin, TX (US)

(72) Inventors: Brandt Braswell, Chandler, AZ (US); George Kunnen, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/267,356

(22) Filed: Sep. 16, 2016

(51) Int. Cl.
*H03M 3/00* (2006.01)
*H03M 1/12* (2006.01)

(52) U.S. Cl.
CPC ......... *H03M 1/1245* (2013.01); *H03M 3/422* (2013.01); *H03M 3/436* (2013.01); *H03M 3/464* (2013.01)

(58) Field of Classification Search
CPC .... H03M 1/1245; H03M 3/464; H03M 3/422; H03M 3/414
USPC ........................................... 341/76, 77, 143
See application file for complete search history.

(56) References Cited

U.S. PATENT DOCUMENTS

| | | | |
|---|---|---|---|
| 4,876,543 A | 10/1989 | van Bavel | |
| 7,609,187 B2 * | 10/2009 | Maezawa | H03M 3/458 341/143 |
| 8,471,743 B2 * | 6/2013 | Huang | H03M 1/502 341/143 |
| 8,593,318 B2 * | 11/2013 | Kaald | H03M 3/37 341/143 |
| 8,952,837 B2 | 2/2015 | Kim et al. | |
| 9,094,040 B2 | 7/2015 | Koli | |

OTHER PUBLICATIONS

Ortmanns, M. et al., "Multirate Cascaded Continuous Time ΣΔ Modulators", IEEE International Symposium on Circuits and Systems, 2002, pp. IV-225-IV-228.
Tortosa, R. et al., "A New High-Level Synthesis Methodology of Cascaded Continuous-Time ΣΔ Modulators", IEEE Transactions on Circuits and Systems-II: Express Briefs, vol. 53, No. 8, Aug. 2006, pp. 739-743.
Xu, Y. et al., "Highly Linear Continuous-Time MASH ΔΣ ADC with Dual VCO-based Quantizers", 2015 IEEE International Symposium on Circuits and Systems (ISCAS), pp. 2033-2036.
Zaliasl, S. et al., "A 12.5-bit 4 MHz 13.8 mW MASH ΔΣ Modulator With Multirated VCO-Based ADC", IEEE Transactions on Circuits and Systems-I: Regular Papers, vol. 59, No. 8, Aug. 2012, pp. 1604-1613.

* cited by examiner

*Primary Examiner* — Khai M Nguyen

(57) ABSTRACT

A multi-rate cascaded continuous-time analog-to-digital converter has a plurality of sigma-delta modulator stages and includes first and second continuous-time sigma-delta modulators, and a summation element. The first continuous-time sigma-delta modulator operates at a first sampling rate. The second continuous-time sigma-delta modulator operates at a second sampling rate higher than the first sampling rate. The second continuous-time sigma-delta modulator has a continuous-time voltage controlled oscillator (VCO) quantizer, and a feedback loop coupled between the input and the output. The second continuous-time sigma-delta modulator is cascaded with the first continuous-time sigma-delta modulator. The summation element has inputs coupled to outputs of the first and second continuous-time sigma-delta modulators.

20 Claims, 2 Drawing Sheets

CONTINUOUS-TIME CASCADED SIGMA-DELTA ANALOG-TO-DIGITAL CONVERTER

BACKGROUND

Field

This disclosure relates generally to electrical circuits, and more specifically, to a continuous-time cascaded sigma-delta analog-to-digital converter (ADC).

Related Art

Continuous-time analog-to-digital converters are commonly used in wireless communications. Multi-rate cascaded continuous-time ADCs provide the advantages of both high speed and high resolution. However, multi-rate cascaded continuous-time ADCs can be difficult to scale and may be power and area inefficient. Therefore, there is a need for a multi-rate cascaded continuous-time ADC that is easier to scale and that provides better power and area efficiency.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
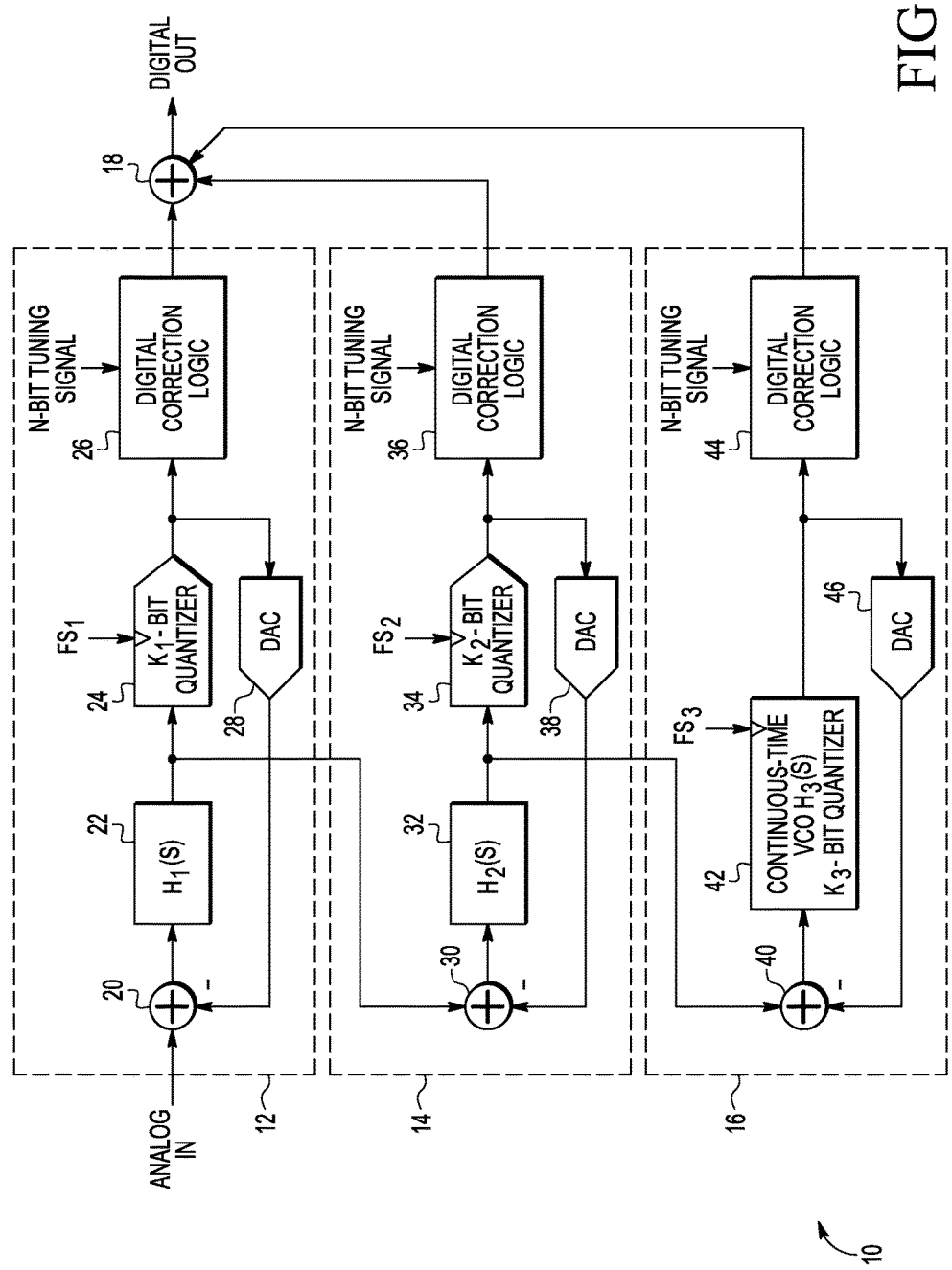
FIG. 1 illustrates a diagram of a multi-rate continuous-time sigma-delta ADC in accordance with an embodiment.

Generally, there is provided, a multi-rate cascaded continuous-time sigma-delta ADC that uses continuous-time sigma-delta modulators in the first stages and a continuous-time sigma-delta modulator having a VCO quantizer as the final stage. The first stage uses a lower sampling rate than the later stages. In one embodiment, the sampling rate of the final stage is an integer multiple of the sampling rate of the first stage. The VCO quantizer in the final stage uses a current-starved ring oscillator. The continuous-time sigma-delta modulators in the later stages provides better over-sampling since they are sampled at a higher rate. Also, the use of the VCO quantizer in the final stage allows for easier scaling. The first stage is characterized by a lower sampling rate and low-bit quantizer operation allowing for easier implementation of a higher order loop stage.

In one embodiment, there is provided, a multi-rate cascaded continuous-time analog-to-digital converter comprising: at least one first continuous-time sigma-delta modulator configured to operate at a first sampling rate, each of the at least one first continuous-time sigma-delta modulators having an input, an output, and a feedback loop coupled between the input and the output; a second continuous-time sigma-delta modulator configured to operate at a second sampling rate higher than the first sampling rate, the second continuous-time sigma-delta modulator having an input, an output, a continuous-time voltage controlled oscillator (VCO) quantizer, and a feedback loop coupled between the input and the output, wherein the second continuous-time sigma-delta modulator is cascaded with the at least one continuous-time sigma-delta modulator; and a summation element having inputs coupled to the outputs of the at least one first continuous-time sigma-delta modulator and the second continuous-time sigma-delta modulator, and an output. The at least one first continuous-time sigma-delta modulator may comprise: a difference element having a first input coupled to receive an analog input signal, a second input coupled to receive a feedback signal, and an output; a loop filter coupled to the output of the difference element; a quantizer coupled to the loop filter; a feedback loop coupled between an output of the quantizer and the second input of the first difference element for providing the feedback signal; and digital logic coupled to the output of the quantizer for providing a digital signal. The quantizer may be a 1-bit quantizer. The digital logic may operate at the second sampling rate. The digital logic may receive a control signal for tuning a transfer function of the digital logic. The feedback loops of the at least one first continuous-time sigma-delta modulator and the second continuous-time sigma-delta modulator may comprise a digital-to-analog converter. The second continuous-time sigma-delta modulator may comprise: a difference element having a first input coupled to the output of the at least one first continuous-time sigma-delta modulator, a second input coupled to receive a feedback signal, and an output; a continuous-time voltage controlled oscillator (VCO) quantizer; a feedback loop coupled between an output of the VCO quantizer and the second input of the difference element for providing the feedback signal; and digital logic coupled to the output of the VCO quantizer for providing a digital signal. The digital logic may operate at the second sampling rate. The digital logic may receive a control signal for tuning a transfer function of the digital logic. The second sampling rate may be an integer multiple of the first sampling rate. A first continuous-time sigma-delta modulator of the at least one first continuous-time sigma-delta modulator may be a second order continuous-time sigma-delta modulator, and the second continuous-time sigma-delta modulator may be a first order continuous-time sigma-delta modulator.

In another embodiment, there is provided, a multi-rate cascaded continuous-time analog-to-digital converter comprising: a first continuous-time sigma-delta modulator configured to operate at a first sampling rate, the first continuous-time sigma-delta modulator comprising: a first difference element having a first input coupled to receive an analog input signal, a second input coupled to receive a first feedback signal, and an output; a first loop filter coupled to the output of the difference element; a first quantizer coupled to the first loop filter; a first feedback loop coupled between an output of the first quantizer and the second input of the first difference element for providing the first feedback signal; and first digital logic coupled to the output of the first quantizer for providing a first digital signal; a second continuous-time sigma-delta modulator configured to operate at a second sampling rate higher than the first sampling rate, the second continuous-time sigma-delta modulator comprising: a second difference element having a first input coupled to an output of the first loop filter, a second input coupled to receive a second feedback signal, and an output; a continuous-time voltage controlled oscillator (VCO) quantizer; a second feedback loop coupled between an output of the VCO quantizer and the second input of the second difference element for providing the second feedback signal; and second digital logic coupled to the output of the VCO quantizer for providing a second digital signal; and a summation element having a first input coupled to the first digital logic for receiving the first digital signal, and a second input coupled to the second digital logic for receiving the second digital signal, and an output for providing a digital output signal. The second sampling rate may be an integer multiple of the first sampling rate. The first and second digital logic may both operate at the second sampling rate. The first and second digital logic may each receive a control signal for tuning a transfer function of the digital logic. The first continuous-time sigma-delta modulator is a second order continuous-time sigma-delta modulator, and the second continuous-time sigma-delta modulator is a first order continuous-time sigma-delta modulator.

In yet another embodiment, there is provided, a multi-rate cascaded continuous-time analog-to-digital converter comprising: a first continuous-time sigma-delta modulator configured to operate at a first sampling rate, the first continuous-time sigma-delta modulator comprising: a first difference element having a first input coupled to receive an analog input signal, a second input coupled to receive a first feedback signal, and an output; a first loop filter coupled to the output of the difference element; a first quantizer coupled to the first loop filter; a first feedback loop coupled between an output of the first quantizer and the second input of the first difference element for providing the first feedback signal; and first digital logic coupled to the output of the quantizer for providing a first digital signal; a second continuous-time sigma-delta modulator configured to operate at a second sampling rate, the second sampling rate being greater than or equal to the first sampling rate, the second continuous-time sigma-delta modulator comprising: a second difference element having a first input coupled to receive an analog input signal, a second input coupled to receive a second feedback signal, and an output; a second loop filter coupled to the output of the difference element; a second quantizer coupled to the second loop filter; a second feedback loop coupled between an output of the second quantizer and the second input of the second difference element for providing the second feedback signal; and second digital logic coupled to the output of the second quantizer for providing a second digital signal; a third continuous-time sigma-delta modulator configured to operate at a third sampling rate higher than the first and second sampling rates, the third continuous-time sigma-delta modulator comprising: a third difference element having a first input coupled to an output of the second loop filter, a second input coupled to receive a third feedback signal, and an output; a continuous-time voltage controlled oscillator (VCO) quantizer; a third feedback loop coupled between an output of the VCO quantizer and the second input of the third difference element for providing the third feedback signal; and third digital logic coupled to the output of the VCO quantizer for providing a third digital signal; and a summation element having a first input coupled to the first digital logic for receiving the first digital signal, a second input coupled to the second digital logic for receiving the second digital signal, a third input coupled to the third digital logic for receiving the third digital signal, and an output for providing a digital output signal.

The first continuous-time sigma-delta modulator may be a second order continuous-time sigma-delta modulator, the second continuous-time sigma-delta modulator may be a first order continuous-time sigma-delta modulator, and the third continuous-time sigma-delta modulator may be a first order continuous-time sigma-delta modulator. The first, second, and third digital logic may operate at the third sampling rate. The first, second, and third digital logic may each receive a control signal for tuning a transfer function of the first, second, and third digital logic.

FIG. 1 illustrates a diagram of multi-rate continuous-time sigma-delta ADC 10 in accordance with an embodiment. Sigma-delta ADC 10 includes sigma-delta modulators 12, 14, and 16, and summation element 18. Sigma-delta modulator 12 includes summation element 20, loop filter 22, $K_1$-bit quantizer 24, digital correction logic 26, and digital-to-analog converter (DAC) 28. Sigma-delta modulator 14 includes summation element 30, loop filter 32, $K_2$-bit quantizer 34, digital correction logic 36, and DAC 38. Sigma-delta modulator 16 includes summation element 40, voltage controller oscillator (VCO) quantizer 42, digital correction logic 44, and DAC 46.

In sigma-delta modulator 12, summation element 20 has a first input for receiving an analog signal labeled ANALOG IN, a second input for receiving a negative feedback signal, and an output for providing a difference of the negative feedback signal and analog input signal ANALOG IN. Loop filter 22 includes a transfer function $H_1(s)$ and has an input connected to the output of summation element 20, and an output. Quantizer 24 has an input connected to the output of loop filter 22, an output, and a clock input for receiving a clock signal labeled $FS_1$. Digital-to-analog converter 28 has an input connected to the output of quantizer 24, and an output connected to the second input of summation element 20 for providing the negative feedback signal. Digital correction logic 26 has an input connected to the output of quantizer 24, an output connected to a first input of summation element 18, and a control input for receiving a tuning signal labeled N-BIT TUNING SIGNAL.

In sigma-delta modulator 14, summation element 30 has a first input connected to the output of loop filter 22, a second input for receiving a negative feedback signal from DAC 38, and an output. Loop filter 32 includes a transfer function $H_2(s)$ and has an input connected to the output of summation element 30, and an output. Quantizer 34 has an input connected to the output of loop filter 32, a clock input for receiving a clock signal labeled $FS_2$, and an output. Digital-to-analog converter 38 has an input connected to the output of quantizer 34, and an output for providing the negative feedback signal to the second input of summation element 30. Digital correction logic 36 has an input connected to the output of quantizer 34, a control input for receiving control signal N-BIT TUNING SIGNAL, and an output connected to a second input of summation element 18.

In sigma-delta modulator 16, summation element 40 has a first input connected to the output of loop filter 32, a second input for receiving a negative feedback signal from the output of DAC 46, and an output for providing a difference signal. Continuous-time VCO quantizer 42 has an input connected to the output of summation element 40, a control input for receiving a clock signal labeled $FS_3$, and an output. Digital-to-analog converter 46 has an input connected to the output of VCO quantizer 42, and an output connected to the second input of summation element 40. Digital correction logic 44 has an input connected to the output of VCO quantizer 42, a control input for receiving control signal N-bit TUNING SIGNAL 44, and an output connected to a third input of summation element 18. Summation element 18 has an output for providing a digital output signal labeled DIGITAL OUT.

In operation, each of sigma-delta modulators 12, 14, and 16 function as stages of the cascaded multi-rate continuous-time sigma-delta ADC 10. Note that three stages are shown as an example; there can be any number of stages in other embodiments. An output of a preceding stage is coupled to an input of a succeeding stage. Sigma-delta modulators 12 and 14 are implemented as conventional continuous-time sigma-delta modulators with feedback, and with quantizers of one or more bits. A difference between an input signal and a negative feedback signal are provided by outputs of summing elements 20, 30, and 40 to quantizers 24, 34, and 42, respectively. The first sigma-delta modulator 12 is sampled at a lower rate $FS_1$. The lower rate can be applied to intermediate sigma-delta modulator stage 14. The sample rate $FS_2$ can be equal to or greater than sample rate $FS_1$. Only the output of the last integrator of the preceding stage is fed to the input of the next stage in the cascade. Quantizer 24, in the first stage, is a 1-bit quantizer or can be a $K_1$-bit quantizer where $K_1$ is an integer. The last stage sigma-delta modulator 16 is implemented as a first order sigma-delta loop that uses a $K_3$ bit VCO quantizer 42, where $K_3$ is an integer. Variable $K_3$ can be the same as or different from variable $K_1$. The sigma-delta modulator 16 operates at $FS_3$ sample rate, where $FS_3$ is higher than $FS_1$ and higher than or equal to $FS_2$. Digital correction logic outputs operate at the higher sampling rate $FS_3$. The digital correction filter outputs are digitally summed by summation element 18 to attain the overall ADC output DIGITAL OUT.

The loop filter transfer functions 22 and 32 can be implemented using either a gm-C architecture or an active resistor-capacitor (RC) filter architecture. Transfer functions 22 and 32 are designed separately and used in the continuous-time domain rather than the discrete-time domain. Designing the loop filters in the continuous-time domain allows for a more optimized analog architecture, that is, only a single path is needed from each stage to the next stage such as the paths to summation elements 30 and 40. Designing in the discrete-time domain would typically require multiple paths from one stage to the next. Using a lower sampling rate in the first stage reduces the bandwidth and power consumption requirements of the operational amplifiers needed for the implementation of the integrators in the first stage. There are several benefits of using a 1-bit quantizer in the sigma-delta modulators. The 1-bit quantizer is much smaller and simpler to implement in comparison to a conventional comparator-based multi-bit quantizer. Also, the 1-bit feedback DAC of each of the stages is linear. This reduces the area and power required to provide good linearity of quantizer 24, in the first stage, as compared to a multi-bit feedback DAC.

The last sigma-delta modulator stage 16 is implemented as a first order sigma-delta loop that uses a $K_3$-bit quantizer clocked at a high rate compared to the clock rate of the first sigma-delta modulator 12. The clock rate of stage 16 is $FS_3=L*FS_1$, where L is an integer greater than or equal to 2. VCO quantizer 42 includes a current starved ring oscillator (not shown). The feedback signal for DAC 46 is converter to a current-mode signal in VCO quantizer 42, summed and fed into a current starved ring oscillator. For a $K_3$-bit quantizer, the ring oscillator will have $2^{(K_3-1)}$ stages. VCO quantizer 42 is relatively small compared to a conventional comparator-based quantizer. Also, VCO quantizer 42 scales well with smaller semiconductor technology node scaling, thus enabling higher sampling rates and higher oversampling. Using a higher sampling rate in the last stage provides a more accurate estimation of the quantization noise of the previous stages. Linearity requirements of DAC 46 are reduced due to the large amount of loop gain from the previous stage(s). This avoids the need for larger area and power requirements.

The outputs of each of stages 12, 14, and 16 are fed through digital correction logic, or filters, which operate at the higher sampling rate of $FS_3$. Digital correction logic 26, 36, and 44 are determined by realizing all of the intermediate loop filter transfer functions that represent the input of a subsequent quantizer divided by the output of a preceding quantizer. As illustrated, the digital correction logic 26, 36, and 44 may be tuned in response to an N-bit tuning signal. In one embodiment, the N-bit tuning signal may be an N-bit value in a register for selecting one or more filter coefficients for adjusting the transfer functions.

Figure 2:
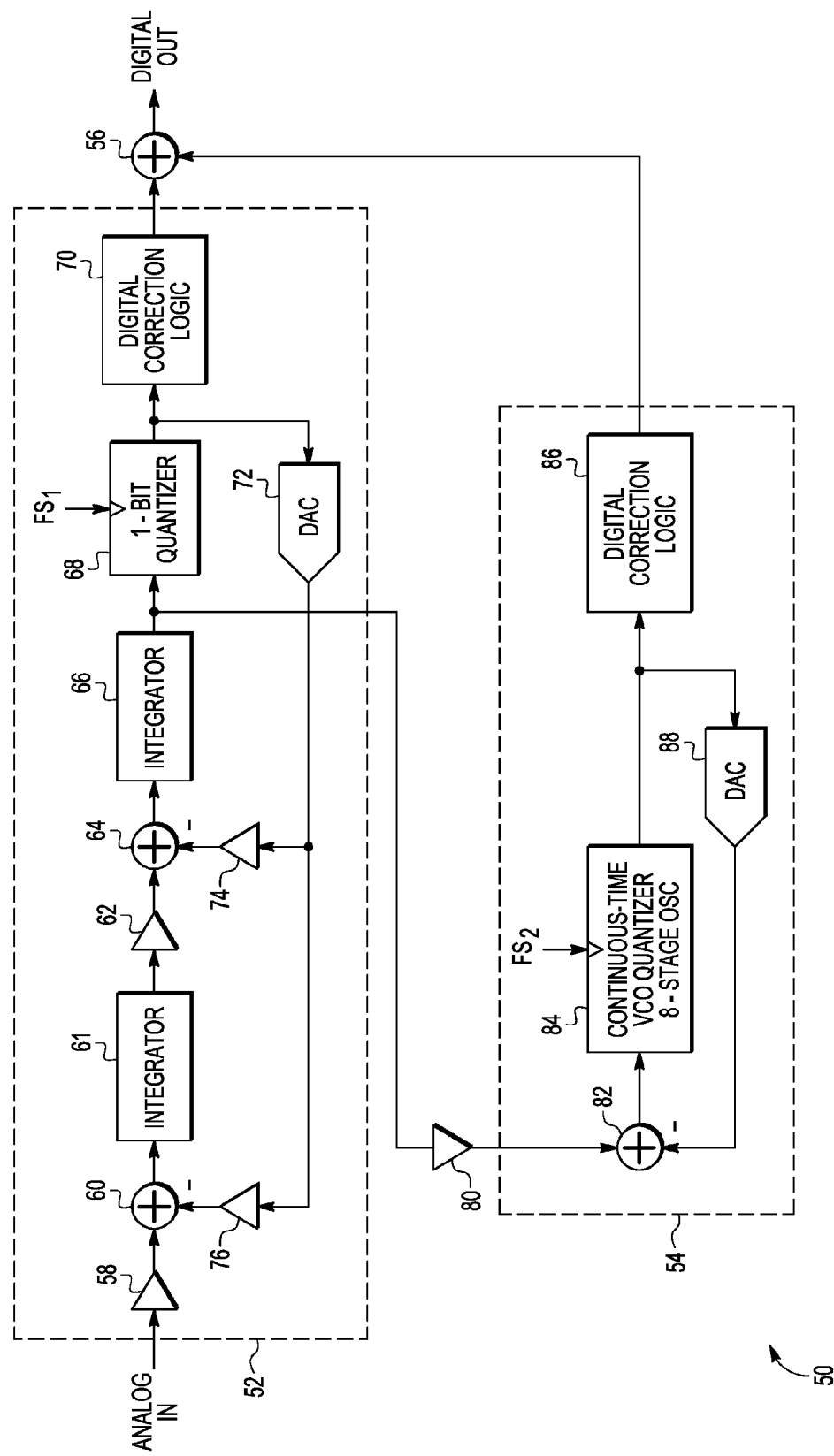
FIG. 2 illustrates a diagram of a multi-rate continuous-time sigma-delta ADC in accordance with another embodiment.

FIG. 2 illustrates a diagram of multi-rate cascaded continuous-time sigma-delta ADC 50 in accordance with another embodiment. Sigma-delta ADC 50 includes sigma-delta modulator 52, sigma-delta modulator 54, summation element 56, and gain element 80. Sigma-delta modulator 52 includes gain elements 58, 62, 74, and 76, continuous-time integrators 61 and 66, summation elements 60 and 64, 1-bit quantizer 68, DAC 72, and digital correction logic 70. Sigma-delta modulator 54 includes summation element 82, VCO quantizer 84, digital correction logic 86, and DAC 88.

In sigma-delta modulator 52, gain element 58 has an input for receiving analog signal ANALOG IN, and an output. summation element 60 has a first input connected to the output of gain element 58, a second input for receiving a negative feedback signal, and an output for providing a difference between analog signal ANALOG IN and the negative feedback signal. Integrator 61 has an input connected to the output of summation element 60, and an output. Gain element 62 has an input connected to the output of integrator 61, and an output. Summation element 64 has a first input connected to the output of gain element 62, a second input, and an output. Integrator 66 has an input connected to the output of summation element 64, and an output. Quantizer 68 has an input connected to the output of integrator 66, control input for receiving a clock signal labeled $FS_1$, and an output. Digital-to-analog converter 71 has an input connected to the output of quantizer 68, and an output. Gain element 74 has an input connected to the output of DAC 72, and an output connected to the second input of summation element 64. Gain element 76 has an input connected to the output of DAC 72, and an output connected to the second input of summation element 60. Digital correction logic 70 has an input connected to the output of quantizer 68, and an output connected to a first input of summation element 56. Gain element 80 has an input connected to the output of integrator 66, and an output.

In sigma-delta modulator 54, summation element 82 has a first input connected to the output of gain element 80, a second input for receiving a negative feedback signal, and an output. Continuous-time VCO quantizer 84 has an input connected to the output of summation element 82, a clock input for receiving a clock signal $FS_2$, and an output. Digital correction logic 86 has an input connected to the output of VCO quantizer 84, and an output connected to a second input of summation element 56. Digital-to-analog converter 88 has an input connected to the output of VCO quantizer 84, and an output connected to the second input of summation element 82. Summation element 56 has an output for providing a digital output signal DIGITAL OUT.

Multi-rate cascaded continuous-time sigma-delta ADC 50 is a specific example using two sigma-delta modulator stages. The first modulator stage 52 has a sample rate of $FS_1$ and the final modulator stage 54 has a sample rate of $FS_2$, where $FS_2$ is $L*FS_1$ and L is an integer greater than or equal to 2. Quantizer 68 is a 1-bit quantizer, but can be a multi-bit quantizer in other embodiments. Quantizer 85 of final stage 54 is a continuous-time VCO quantizer having an 8-stage current starved oscillator. In other embodiments, the number of oscillator stages may be different. Each of digital correction logic 70 and 86 are clocked at the higher sampling rate $FS_2$. Negative feedback is provided from the output of the first stage 52 to an input of summation elements 60 and 64.

A difference signal is output from the summation elements 60 and 64 to integrators 61 and 66, respectively. Two-stage sigma-delta ADC 50 can be extended to have more than two stages as discussed above regarding FIG. 1.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A multi-rate cascaded continuous-time analog-to-digital converter comprising:
   at least one first continuous-time sigma-delta modulator configured to operate at a first sampling rate, each of the at least one first continuous-time sigma-delta modulators having an input, an output, and a feedback loop coupled between the input and the output;
   a second continuous-time sigma-delta modulator configured to operate at a second sampling rate higher than the first sampling rate, the second continuous-time sigma-delta modulator having an input, an output, a continuous-time voltage controlled oscillator (VCO) quantizer, and a feedback loop coupled between the input and the output, wherein the second continuous-time sigma-delta modulator is cascaded with the at least one continuous-time sigma-delta modulator; and
   a summation element having inputs coupled to the outputs of the at least one first continuous-time sigma-delta modulator and the second continuous-time sigma-delta modulator, and an output.

2. The multi-rate cascaded continuous-time analog-to-digital converter of claim 1,
   wherein the at least one first continuous-time sigma-delta modulator comprises:
   a difference element having a first input coupled to receive an analog input signal, a second input coupled to receive a feedback signal, and an output;
   a loop filter coupled to the output of the difference element;
   a quantizer coupled to the loop filter;
   a feedback loop coupled between an output of the quantizer and the second input of the first difference element for providing the feedback signal; and
   digital logic coupled to the output of the quantizer for providing a digital signal.

3. The multi-rate cascaded continuous-time analog-to-digital converter of claim 2, wherein the quantizer is a 1-bit quantizer.

4. The multi-rate cascaded continuous-time analog-to-digital converter of claim 2, wherein the digital logic operates at the second sampling rate.

5. The multi-rate cascaded continuous-time analog-to-digital converter of claim 2, wherein the digital logic receives a control signal for tuning a transfer function of the digital logic.

6. The multi-rate cascaded continuous-time analog-to-digital converter of claim 1, wherein the feedback loops of the at least one first continuous-time sigma-delta modulator and the second continuous-time sigma-delta modulator comprises a digital-to-analog converter.

7. The multi-rate cascaded continuous-time analog-to-digital converter of claim 1,
   wherein the second continuous-time sigma-delta modulator comprises:
   a difference element having a first input coupled to the output of the at least one first continuous-time sigma-delta modulator, a second input coupled to receive a feedback signal, and an output;
   a continuous-time voltage controlled oscillator (VCO) quantizer;
   a feedback loop coupled between an output of the VCO quantizer and the second input of the difference element for providing the feedback signal; and
   digital logic coupled to the output of the VCO quantizer for providing a digital signal.

8. The multi-rate cascaded continuous-time analog-to-digital converter of claim 7, wherein the digital logic operates at the second sampling rate.

9. The multi-rate cascaded continuous-time analog-to-digital converter of claim 7, wherein the digital logic receives a control signal for tuning a transfer function of the digital logic.

10. The multi-rate cascaded continuous-time analog-to-digital converter of claim 1, wherein the second sampling rate is an integer multiple of the first sampling rate.

11. The multi-rate cascaded continuous-time analog-to-digital converter of claim 1, wherein a first continuous-time sigma-delta modulator of the at least one first continuous-time sigma-delta modulator is a second order continuous-time sigma-delta modulator, and the second continuous-time sigma-delta modulator is a first order continuous-time sigma-delta modulator.

12. A multi-rate cascaded continuous-time analog-to-digital converter comprising:
   a first continuous-time sigma-delta modulator configured to operate at a first sampling rate, the first continuous-time sigma-delta modulator comprising:
   a first difference element having a first input coupled to receive an analog input signal, a second input coupled to receive a first feedback signal, and an output;

a first loop filter coupled to the output of the difference element;
a first quantizer coupled to the first loop filter;
a first feedback loop coupled between an output of the first quantizer and the second input of the first difference element for providing the first feedback signal; and
first digital logic coupled to the output of the first quantizer for providing a first digital signal;
a second continuous-time sigma-delta modulator configured to operate at a second sampling rate higher than the first sampling rate, the second continuous-time sigma-delta modulator comprising:
a second difference element having a first input coupled to an output of the first loop filter, a second input coupled to receive a second feedback signal, and an output;
a continuous-time voltage controlled oscillator (VCO) quantizer;
a second feedback loop coupled between an output of the VCO quantizer and the second input of the second difference element for providing the second feedback signal; and
second digital logic coupled to the output of the VCO quantizer for providing a second digital signal; and
a summation element having a first input coupled to the first digital logic for receiving the first digital signal, and a second input coupled to the second digital logic for receiving the second digital signal, and an output for providing a digital output signal.

13. The multi-rate cascaded continuous-time analog-to-digital converter of claim 12, wherein the second sampling rate is an integer multiple of the first sampling rate.

14. The multi-rate cascaded continuous-time analog-to-digital converter of claim 12, wherein the first and second digital logic both operate at the second sampling rate.

15. The multi-rate cascaded continuous-time analog-to-digital converter of claim 12, wherein the first and second digital logic each receives a control signal for tuning a transfer function of the digital logic.

16. The multi-rate cascaded continuous-time analog-to-digital converter of claim 12, wherein the first continuous-time sigma-delta modulator is a second order continuous-time sigma-delta modulator, and the second continuous-time sigma-delta modulator is a first order continuous-time sigma-delta modulator.

17. A multi-rate cascaded continuous-time analog-to-digital converter comprising:
a first continuous-time sigma-delta modulator configured to operate at a first sampling rate, the first continuous-time sigma-delta modulator comprising:
a first difference element having a first input coupled to receive an analog input signal, a second input coupled to receive a first feedback signal, and an output;
a first loop filter coupled to the output of the difference element;
a first quantizer coupled to the first loop filter;
a first feedback loop coupled between an output of the first quantizer and the second input of the first difference element for providing the first feedback signal; and
first digital logic coupled to the output of the quantizer for providing a first digital signal;
a second continuous-time sigma-delta modulator configured to operate at a second sampling rate, the second sampling rate being greater than or equal to the first sampling rate, the second continuous-time sigma-delta modulator comprising:
a second difference element having a first input coupled to receive an analog input signal, a second input coupled to receive a second feedback signal, and an output;
a second loop filter coupled to the output of the difference element;
a second quantizer coupled to the second loop filter;
a second feedback loop coupled between an output of the second quantizer and the second input of the second difference element for providing the second feedback signal; and
second digital logic coupled to the output of the second quantizer for providing a second digital signal;
a third continuous-time sigma-delta modulator configured to operate at a third sampling rate higher than the first and second sampling rates, the third continuous-time sigma-delta modulator comprising:
a third difference element having a first input coupled to an output of the second loop filter, a second input coupled to receive a third feedback signal, and an output;
a continuous-time voltage controlled oscillator (VCO) quantizer;
a third feedback loop coupled between an output of the VCO quantizer and the second input of the third difference element for providing the third feedback signal; and
third digital logic coupled to the output of the VCO quantizer for providing a third digital signal; and
a summation element having a first input coupled to the first digital logic for receiving the first digital signal, a second input coupled to the second digital logic for receiving the second digital signal, a third input coupled to the third digital logic for receiving the third digital signal, and an output for providing a digital output signal.

18. The multi-rate cascaded continuous-time analog-to-digital converter of claim 17, wherein the first continuous-time sigma-delta modulator is a second order continuous-time sigma-delta modulator, the second continuous-time sigma-delta modulator is a first order continuous-time sigma-delta modulator, and the third continuous-time sigma-delta modulator is a first order continuous-time sigma-delta modulator.

19. The multi-rate cascaded continuous-time analog-to-digital converter of claim 17, wherein the first, second, and third digital logic operate at the third sampling rate.

20. The multi-rate cascaded continuous-time analog-to-digital converter of claim 17, wherein the first, second, and third digital logic each receives a control signal for tuning a transfer function of the first, second, and third digital logic.

* * * * *